United States Patent [19]

Ramaswami

[11] Patent Number: 5,783,475
[45] Date of Patent: Jul. 21, 1998

[54] METHOD OF FORMING A SPACER

[75] Inventor: Shrinath Ramaswami, Gilbert, Ariz.

[73] Assignee: Motorola, Inc., Schaumburg, Ill.

[21] Appl. No.: 974,894

[22] Filed: Nov. 20, 1997

Related U.S. Application Data

[63] Continuation of Ser. No. 555,648, Nov. 13, 1995, abandoned.

[51] Int. Cl.$^6$ .................................................. H01L 21/336
[52] U.S. Cl. ............................................. 438/303; 438/595
[58] Field of Search ................................... 438/230–232, 438/303–307, 595

[56] References Cited

U.S. PATENT DOCUMENTS

| | | | |
|---|---|---|---|
| 4,818,714 | 4/1989 | Haskell | 437/34 |
| 4,908,326 | 3/1990 | Ma et al. | 437/44 |
| 4,925,907 | 5/1990 | Yoshikawa | 437/44 |
| 5,015,595 | 5/1991 | Wollesen | 437/44 |
| 5,015,598 | 5/1991 | Verhaar | 437/44 |
| 5,015,599 | 5/1991 | Verhaar | 437/44 |
| 5,153,145 | 10/1992 | Lee et al. | 437/41 SW |
| 5,183,770 | 2/1993 | Ayukawa et al. | 437/41 SW |
| 5,334,549 | 8/1994 | Eklund | 437/44 |
| 5,371,036 | 12/1994 | Lur et al. | 437/72 |
| 5,420,057 | 5/1995 | Bennett et al. | 437/44 |
| 5,445,984 | 8/1995 | Hong et al. | 437/43 |
| 5,541,132 | 7/1996 | Davies et al. | 437/44 |
| 5,573,965 | 11/1996 | Chen et al. | 437/41 SW |

FOREIGN PATENT DOCUMENTS

| | | | |
|---|---|---|---|
| 62-136022 | 6/1987 | Japan | 437/44 |
| 62-290176 | 12/1987 | Japan | 437/44 |
| 2-3242 | 1/1990 | Japan | 437/44 |
| 6-333943 | 12/1994 | Japan | 437/44 |

*Primary Examiner*—Charles L. Bowers, Jr.
*Assistant Examiner*—Leon Radomsky
*Attorney, Agent, or Firm*—George C. Chen

[57] ABSTRACT

A method of forming a spacer (41) around a gate electrode (32) includes sequentially disposing a first layer (48), a second layer (36), and a third layer (37) of dielectric over a semiconductor substrate (31) and over the gate electrode (32) and, thereafter, sequentially etching the third (37), second (36), and first (48) layers. The third layer (37) is etched with a first etchant to define a width (51) for the spacer (41). The first etchant selectively etches the third layer (37) versus the second layer (36). Etching the third layer (37) does not expose the first layer (48) located beneath the second layer (36). A second etchant, which is different from the first etchant, is used to selectively etch the second layer (36) versus the first layer (48). Etching the second layer (36) does not expose the semiconductor substrate (31) located beneath the first layer (48).

20 Claims, 4 Drawing Sheets

5,783,475

1

METHOD OF FORMING A SPACER

This application is a continuation of prior application Ser. No. 08/555,648, filed Nov. 13, 1995, abandoned.

BACKGROUND OF THE INVENTION

This invention relates, in general, to a method of fabricating a semiconductor component, and more particularly, to a method of forming a spacer.

Conventionally, spacers are formed around a gate electrode of a field effect transistor (FET) to provide an implantation mask for self-aligned source and drain implants and to provide electrical isolation between the gate electrode and the source and drain electrodes during silicide processing. However, many problems are associated with the formation of conventional spacers. For example, the formation of a conventional oxide spacer results in excessive field oxide loss during an overetch used to define the conventional oxide spacer and also results in damage to the underlying semiconductor substrate.

For a conventional nitride spacer, adequate etch selectivity between the nitride and an underlying thermal oxide on the semiconductor substrate is difficult to obtain. Consequently, after the spacer etch, the thickness of the underlying thermal oxide is extremely non-uniform. Because the underlying thermal oxide is used as an implant screen for a subsequent self-aligned source and drain implant, the resulting source and drain implant dopant profile in the semiconductor substrate is also extremely non-uniform. Moreover, due to the poor etch selectivity between the nitride and the underlying thermal oxide, a sufficiently long overetch cannot be used in order to preserve the underlying thermal oxide implant mask. However, if a short overetch is used, the nitride residues over the thermal oxide are not removed, and silicide formation is blocked, which increases interconnect resistance and which reduces circuit speed. On the other hand, if a long overetch is used, the spacer width is not maintained, and an undesirable short-channel phenomenon will dominate the electrical behavior of the fabricated FET.

In an attempt to overcome the aforementioned issues associated with conventional nitride spacers and conventional oxide spacers, the use of disposable polysilicon spacers has been proposed. However, a polysilicon spacer is not compatible with self-aligned silicide processing, which is an essential part of most silicon semiconductor device manufacturing processes.

Accordingly, a need exists for a method of forming a spacer, which does not damage the semiconductor substrate, which does not create excessive field oxide loss, which produces a uniform implant screen for a self-aligned source and drain implant, and which is compatible with self-aligned silicide processing. The method should be cost-effective, compatible with existing process flows, and manufacturable.

DETAILED DESCRIPTION OF THE DRAWINGS

Figure 1:
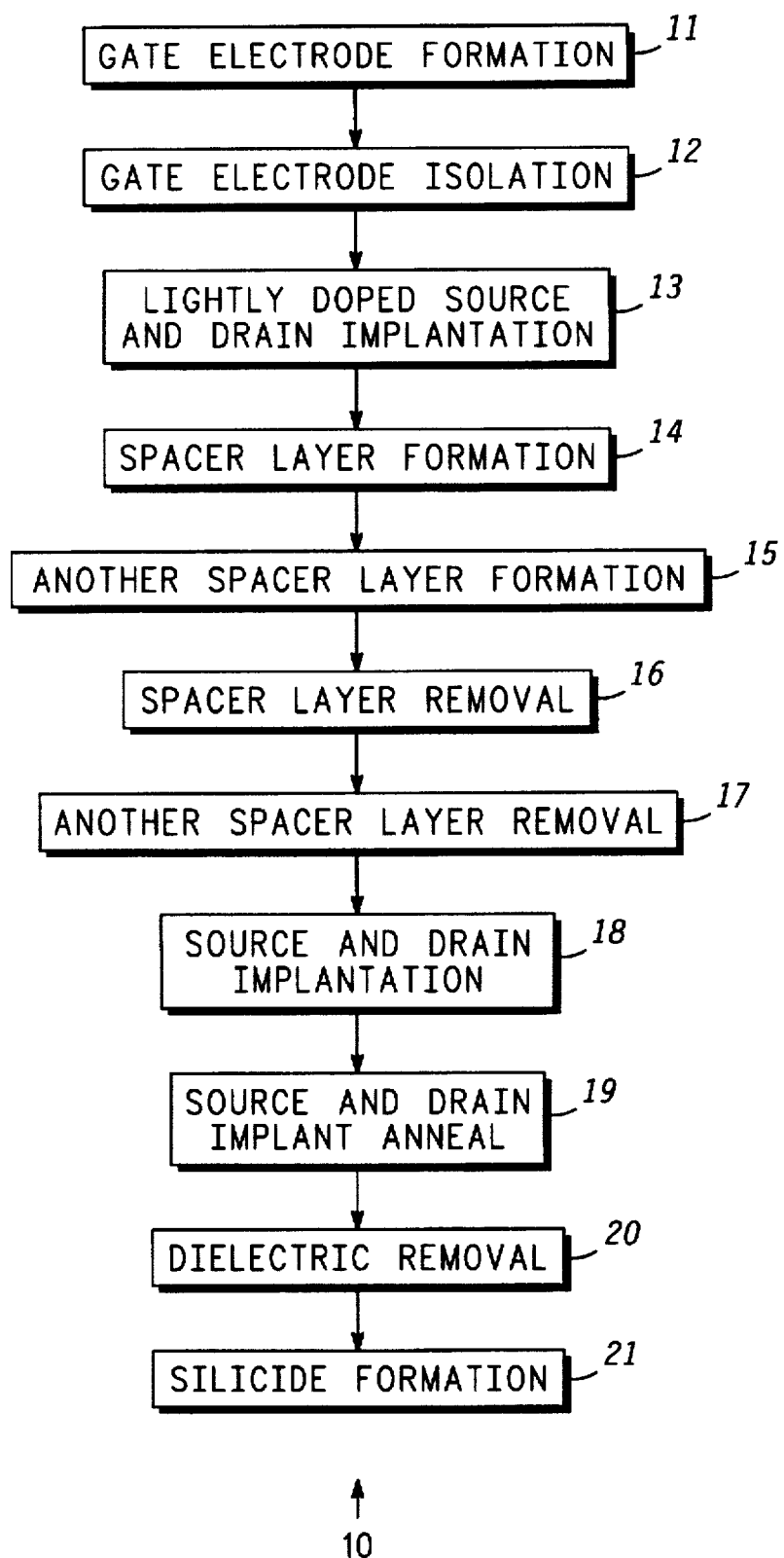
FIG. 1 outlines a process flow for forming a spacer in accordance with the present invention.

Turning to the figures for a detailed description, FIG. 1 outlines a sequence of steps or a method 10 for forming a spacer in accordance with the present invention. Step 11 of method 10 forms a gate electrode, and step 12 reoxidizes the gate electrode. These two initial steps of method 10 are illustrated by a cross-sectional view in FIG. 2 in accordance with the present invention.

Figure 2:
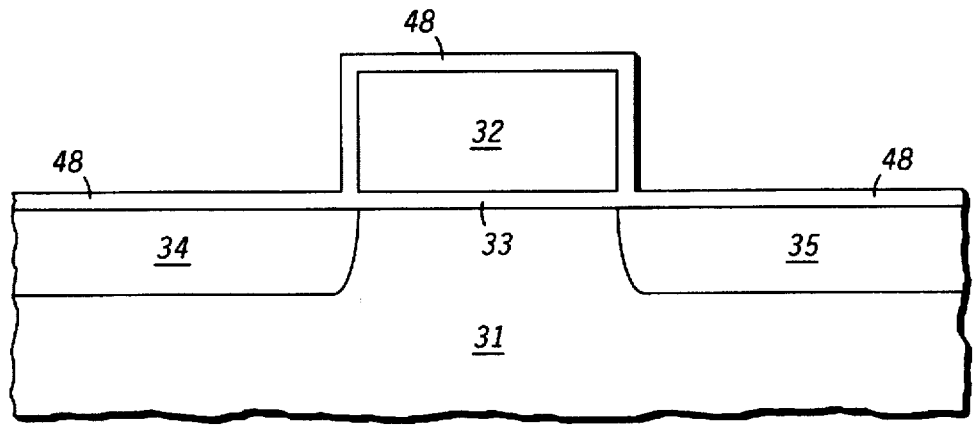
FIGS. 2–6 illustrate cross-sectional views of the formation of a spacer at various steps of the process flow outlined in FIG. 1 and in accordance with the present invention.

In particular, FIG. 2 portrays a semiconductor component or a semiconductor device 30 in and on a substrate 31. While substrate 31 can comprise a myriad of suitable materials over which a spacer is formed, substrate 31 preferably comprises a semiconductor material such as, for example, single crystal silicon or gallium arsenide and is hereinafter referred to as semiconductor substrate 31. Although not depicted in FIG. 2, semiconductor substrate 31 can support a plurality of semiconductor devices.

A gate electrode 32 in FIG. 2 is comprised of silicon and is fabricated over semiconductor substrate 31 during step 11 of method 10 in FIG. 1. As an example of how gate electrode 32 can be formed, a polysilicon layer (not shown) approximately 500–5,000 angstrom (Å) thick is disposed over semiconductor substrate 31 through a pyrolysis of a silane source gas in a low pressure chemical vapor deposition (LPCVD) technique. Then, a patterned photoresist layer (not shown) is provided over the polysilicon layer, and a halogen-containing plasma is used to anisotropically etch the polysilicon layer to form gate electrode 32. After the anisotropic etch, the patterned photoresist layer is removed.

A gate dielectric layer 33 is formed on semiconductor substrate 31 prior to the formation of gate electrode 32 and is located between gate electrode 32 and semiconductor substrate 31 as depicted in FIG. 2. Preferably, gate dielectric layer 33 comprises a thermally grown oxide on the order of 50–200 Å. However, gate dielectric layer 33 can also comprise a nitride in an alternative embodiment.

After the formation of gate electrode 32, a gate electrode isolation is performed in step 12 of method 10 as outlined in FIG. 1 to form a dielectric layer 48 over gate electrode 32 as illustrated in FIG. 2. In a preferred embodiment where gate dielectric layer 33 comprises an oxide, dielectric layer 48 also comprises an oxide and is formed over semiconductor substrate 31 and over and adjacent to gate electrode 32 using a thermal reoxidation. Preferably, dielectric layer 48 is about 50–200 Å thick. In this preferred embodiment, the thermal reoxidation is also used for other reasons such as, for example, to repair gate dielectric layer 33, which may have been damaged during the anisotropic etch used to form gate electrode 32. Because gate dielectric layer 33 and dielectric layer 48 are both comprised of oxide in the preferred embodiment, gate dielectric layer 33 and dielectric layer 48 are depicted as a continuous layer in FIG. 2. In an alternative embodiment, dielectric layer 48 is comprised of a different material compared to gate dielectric layer 33. For example, dielectric layer 48 comprises other suitable dielectric materials including, but not limited to, aluminum nitride, silicon nitride, or doped silicon oxide.

Continuing with step 13 of method 10 in FIG. 1, a lightly doped source and drain implantation is performed. The lightly doped source and drain dopants are implanted through dielectric layer 48 and into semiconductor substrate 31. Depicted in FIG. 2, a lightly doped source region 34 and a lightly doped drain region 35 are both self-aligned to opposite sides of gate electrode 32 and are preferably either both n-type or p-type.

Figure 3:
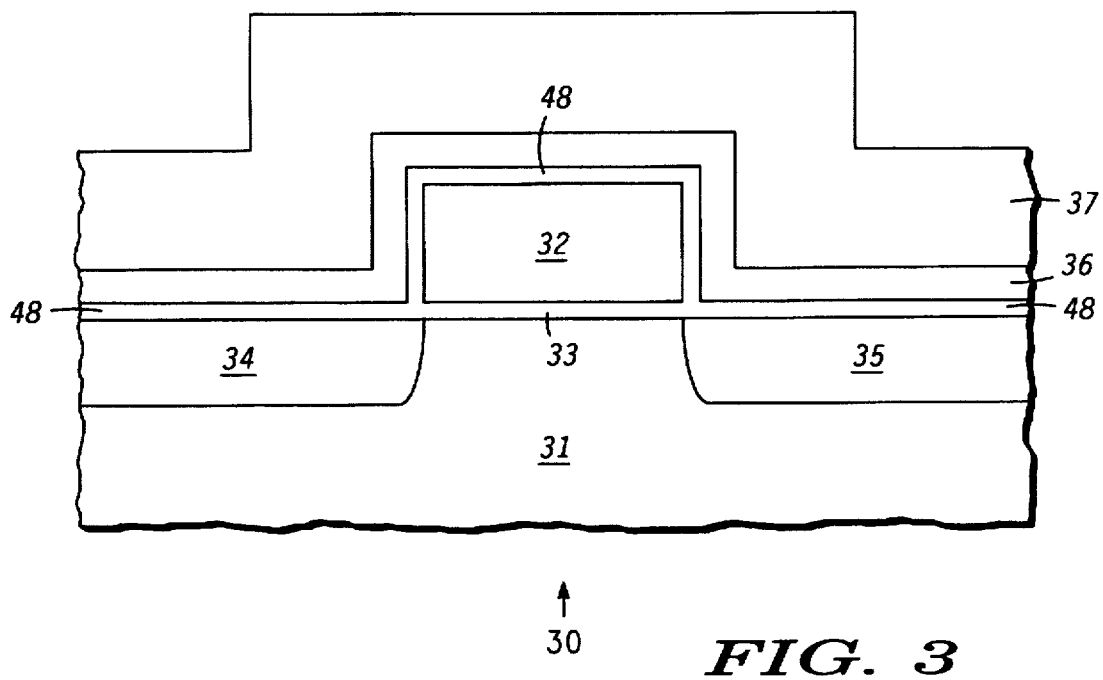

Following the next steps of method 10 in FIG. 1, steps 14 and 15 are now performed as illustrated in FIG. 3. Two spacer layers are formed over dielectric layer 48 and semiconductor substrate 31. In a preferred embodiment, layer or spacer layer 36 preferably comprises 25–750 Å of silicon nitride and is disposed over dielectric layer 48 at approximately 700–800 degrees Celsius (°C.) by reacting dichlorosilane and ammonia in a LPCVD technique. Layer or spacer layer 37 is preferably comprised of silicon oxide and is disposed over spacer layer 36 using a chemical vapor deposition (CVD) technique, which decomposes tetraethyl orthosilicate (TEOS) at temperatures below approximately 650° C. TEOS is preferably used to form spacer layer 37 due to its highly conformal nature. In a preferred embodiment, spacer layer 37 is approximately 1,000–4,000 Å thick. In another preferred embodiment, the combined thickness of spacer layers 36 and 37 is at least as thick as gate electrode 32.

In an alternative embodiment, spacer layers 36 and 37 are comprised of other suitable dielectrics such as aluminum nitride, silicon oxide, or silicon nitride. Optionally, spacer layer 37 and dielectric layer 48 are comprised of a substantially similar material while spacer layer 36 is comprised of a substantially different material. For example, spacer layer 37 and dielectric layer 48 can both be a form of oxide such as a thermal oxide and TEOS, respectively, while spacer layer 36 is comprised of silicon nitride. As an additional example, spacer layer 37 and dielectric layer 48 can both be a form of nitride such as aluminum nitride and silicon nitride, respectively, while spacer layer 36 is comprised of silicon oxide. Alternating layers of dielectric provides sufficient etch selectivity between the different dielectric layers and improves process robustness when forming spacers as explained below.

To more clearly describe a preferred embodiment, spacer layer 36 is referred to as nitride layer 36, spacer layer 37 is referred to as oxide layer 37, and dielectric layer 48 is referred to as oxide layer 48 in the balance of the process described below.

Figure 4:
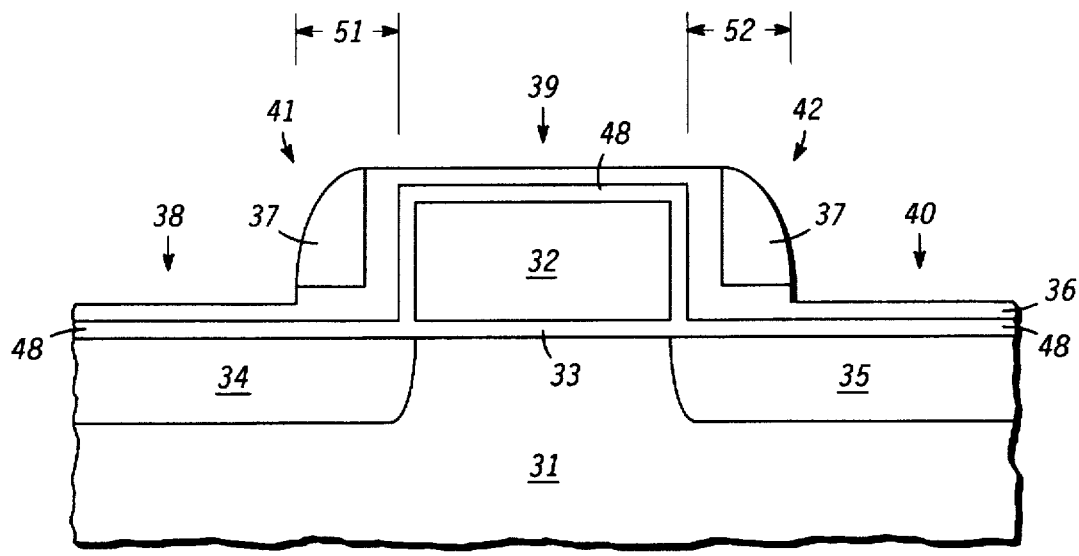

Step 16 of method 10 in FIG. 1 is portrayed in FIG. 4, wherein portions of oxide layer 37 are removed to form a portion of spacers 41 and 42 that are around or adjacent to gate electrode 32. Preferably, step 16 comprises anisotropically etching oxide layer 37 with a reactive ion etch (RIE), which uses a plasma containing trifluoro-methane (CHF$_3$), carbon tetrafluoride (CF$_4$), and argon (Ar). However, regardless of the etchant used in step 16 to etch oxide layer 37, the etchant should have a reasonable etch selectivity between oxide layer 37 and nitride layer 36. The oxide to nitride etch selectivity of the preferred etchant described above is approximately 6:1. After step 16, the remaining portions of oxide layer 37 define a width 51 for spacer 41 and also define a width 52 for spacer 42.

The etch process of step 16, which is designed to etch oxide layer 37, includes an overetch step which terminates in nitride layer 36 to ensure removal of all residues of oxide layer 37. The etch process of step 16 etches into and exposes portions of nitride layer 36 as portrayed in FIG. 4. In particular, after the etch process of step 16, portions 38, 39, and 40 of nitride layer 36 are exposed. Portion 39 is over gate electrode 32 while portions 38 and 40 are over lightly doped source region 34 and lightly doped drain region 35, respectively, of semiconductor device 30.

In step 14, the desired deposition thickness for nitride layer 36 is dependent upon the amount of overetch desired during step 16. A longer overetch for step 16 requires a thicker nitride layer 36, and a shorter overetch for step 16 can use a thinner nitride layer 36. Nitride layer 36 should be of a thickness such that the etch process of step 16 does not expose oxide layer 48, which is under nitride layer 36. Provided that the amount of nitride layer 36 lost during the overetch of step 16 is constant and repeatable, the actual amount of nitride layer 36 lost is not of extreme concern, as long as oxide layer 48 is not exposed prior to step 17. The reason why the exact amount of nitride layer 36 lost during the overetch of step 16 is not of extreme concern and is explained below.

Figure 5:
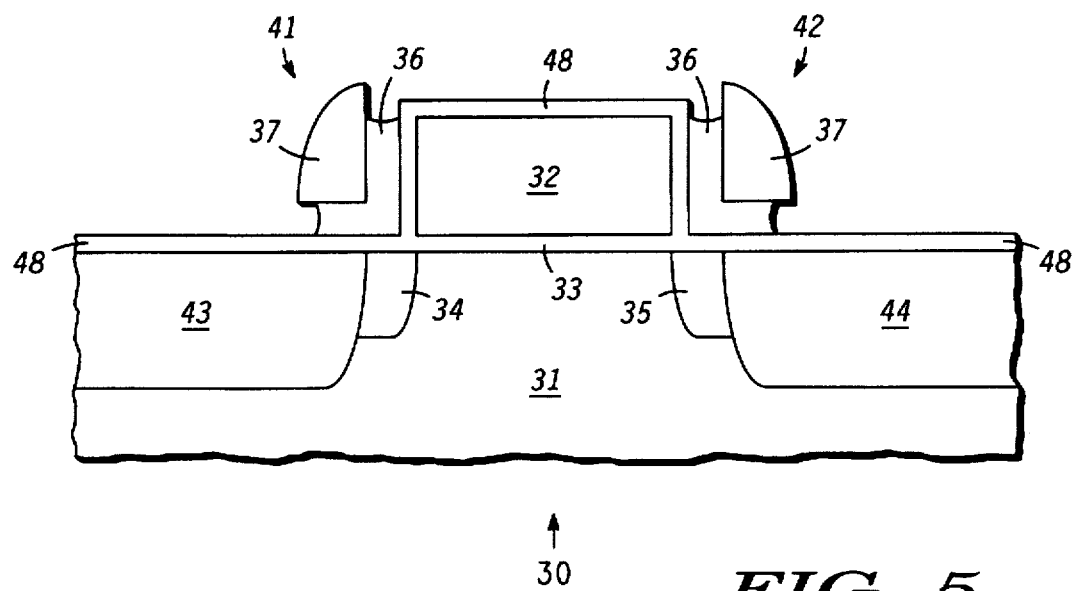

Referring to step 17 of method 10 in FIG. 1, portions of nitride layer 36 are removed as depicted in FIG. 5. In particular, portions 38, 39, and 40 of nitride layer 36, which were exposed after the etching of oxide layer 37, are etched away in step 17. In a preferred embodiment, an isotropic etchant comprised of hot phosphoric acid is used to remove portions 38, 39, and 40. The phosphoric acid does not substantially remove portions of nitride layer 36, which are covered or masked by the remaining portions of oxide layer 37. Phosphoric acid is preferably used due to its high selectivity for etching nitride versus oxide. In a preferred embodiment, the hot phosphoric acid has an etch selectivity of approximately 40:1 for silicon nitride versus thermally grown silicon oxide. Because of the preferred high etch selectivity in step 17, the amount of nitride layer 36 lost during step 16 is not of extreme concern. Even if an overetch is used in step 17, the preferred high etch selectivity of step 17 prevents substantial etching of the underlying oxide layer 48.

Due to its isotropic nature, the phosphoric acid undercuts nitride layer 36 as portrayed in FIG. 5. However, the phosphoric acid should not undercut nitride layer 36 to the point where a subsequently described silicide process shorts the drain or the source to gate electrode 32.

In an alternative embodiment, an anisotropic etchant is used to etch nitride layer 36 to eliminate the undercutting produced by the preferred phosphoric acid. However, regardless of whether a dry, wet, isotropic, or anisotropic etchant is used during step 17 of method 10, a high degree of etch selectivity should be maintained between nitride layer 36 and oxide layer 48 such that oxide layer 48 is not be substantially etched during step 17 and such that the thickness of oxide layer 48 is not significantly impacted by step 17 of method 10. Consequently, the surface of semiconductor substrate 31 located beneath oxide layer 48 is not exposed during step 17.

Oxide layer 48 should not be substantially etched during step 17 in order to ensure that oxide layer 48 has a uniform thickness during step 18, wherein oxide layer 48 is used as an implant screen. Step 18 of FIG. 1 implants dopants through oxide layer 48 and into semiconductor substrate 31 to form a source region 43 and a drain region 44, which are self-aligned to spacer 41 and spacer 42, respectively, as illustrated in FIG. 5. While source region 43 and drain region 44 can be p-type or n-type, they preferably have the same conductivity type as lightly doped source region 34 and lightly doped drain region 35 but have a higher doping concentration compared to the lightly doped source and drain regions. A uniform thickness for oxide layer 48 produces a more uniform implant doping profile for source region 43 and drain region 44.

Subsequently, step 19 of method 10 anneals the implanted dopants of steps 13 and 18 to electrically activate the implanted dopants within semiconductor substrate 31. Following step 19, step 20 removes portions of oxide layers 37 and 48. Consequently, gate electrode 32 and portions of source region 43 and drain region 44 are exposed. Adequate etch selectivity should be maintained during step 20 between oxide layer 48 and the underlying semiconductor substrate 31 and gate electrode 32. Furthermore, semiconductor substrate 31 and gate electrode 32 should not be damaged by the etchant used during step 20. Accordingly, step 20 preferably uses an isotropic wet etch comprised of hydrofluoric (HF) acid, which has a selectivity of greater than 100:1 for etching oxide versus silicon.

In a preferred embodiment where oxide layer 37 is formed from TEOS, where oxide layer 48 is a thermally grown oxide, and where HF acid is used during step 20, a substantial amount of the remaining portions of oxide layer 37 are etched away during step 20. In fact, after step 20, spacers 41 and 42 often no longer contain oxide layer 37 as portrayed in FIG. 6. This phenomenon is due to the fact that oxide layer 37, which is deposited from TEOS, has a much faster etch rate in an HF acid compared to oxide layer 48, which is comprised of thermally grown oxide. However, in an alternative embodiment, spacers 41 and 42 still contain oxide layer 37 after step 20. Although not preferred, the same RIE etchant of the anisotropic etch of step 16, which etches oxide layer 37, can also be used to etch oxide layer 48 in an alternative embodiment. The use of an RIE etchant is not preferred due to the potential of damaging substrate 31 and excessively etching field oxide regions. Regardless of the etchant used, portions of oxide layer 48, which are masked by nitride layer 36, are not removed during step 20.

Figure 6:
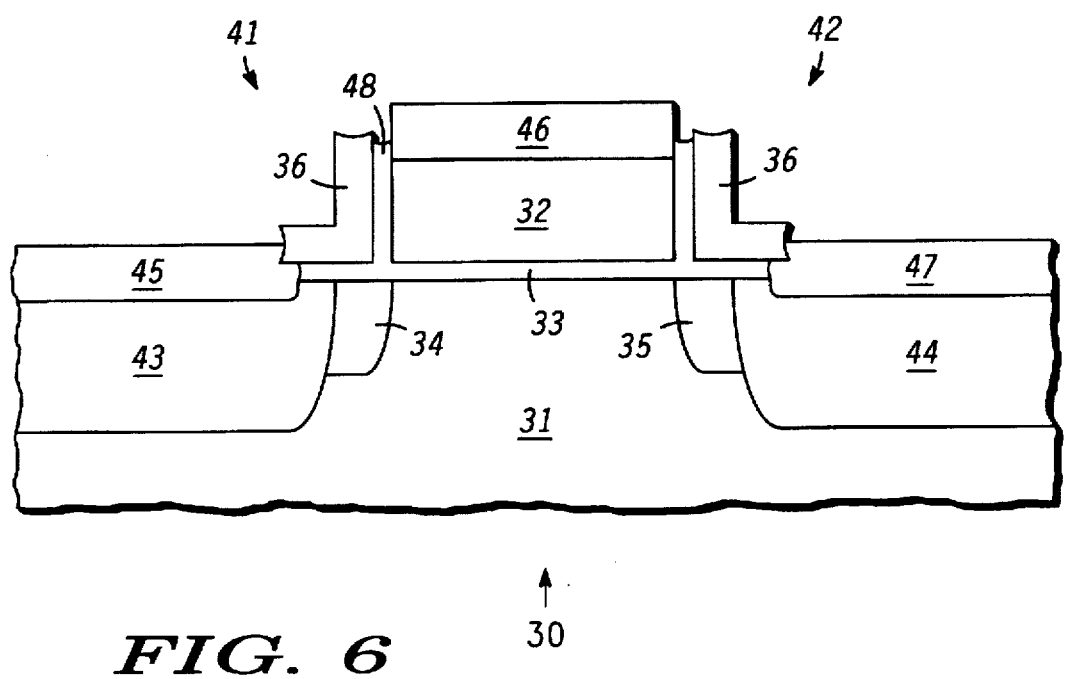

Referring now to step 21 of method 10 in FIG. 1, self-aligned silicide (salicide) contacts are formed in semiconductor substrate 31 as illustrated in FIG. 6. First, a metal used to form the salicide contacts is deposited over semiconductor substrate 31. While platinum, palladium, cobalt, nickel, tungsten, molybdenum, or the like can be deposited over semiconductor substrate 31, titanium is preferably used to form the salicide contacts of the present invention. Next, semiconductor substrate 31 is heated to produce a silicide reaction at locations where the deposited metal directly contacts gate electrode 32, source region 43, and drain region 44. The heating for the silicide reaction is preferably performed in a rapid thermal anneal (RTA) to reduce the amount of dopant diffusion within semiconductor substrate 31 during step 21. Then, any unreacted metal is removed by using an etchant that preferably does not substantially etch the silicide, semiconductor substrate 31, or oxide layer 48.

Thus, upon completing step 21 in FIG. 6, a silicide contact 45 is formed over and electrically coupled to source region 43; a silicide contact 46 is formed over and electrically coupled to gate electrode 32; and a silicide contact 47 is formed over and electrically coupled to drain region 44. Spacers 41 and 42 prevent silicide formation over lightly doped source region 34 and lightly doped drain region 35 and prevent the shorting of gate electrode 32 with source region 43 or drain region 44.

The present invention for forming a spacer, as outlined in method 10 of FIG. 1, introduces two additional process step compared to a conventional process flow. The two additional process steps deposit and etch an extra dielectric layer when forming a spacer. However, the etching of the extra dielectric layer does not require an extra photoresist layer and is not time consuming. Therefore, the cycle time of method 10 is not significantly increased over that of a conventional process. Moreover, the use of multi-layered spacers in the present invention provides a highly robust process because of the use of different etchants, which produces an implant screen of uniform thickness.

The present invention improves the control of widths 51 and 52 of spacers 41 and 42, respectively, and reduces the effects of the short-channel phenomenon. In a conventional process, varying amounts of overetch are required to completely remove all spacer residues. However, varying the overetch varies the width of the spacers. In the present invention, varying amounts of overetch are not required to completely remove all of the spacer residues. In accordance with the present invention, a constant overetch can be used regardless of the density of the underlying topography on semiconductor substrate 31. In practice, it is not necessary to completely remove all of the residues of oxide layer 37 during step 16. The subsequent preferred isotropic etch of step 17 can efficiently undercut the underlying nitride layer 36 to remove the remaining residues of oxide layer 37, which were not completely removed during the etch of step 16. Consequently, the robustness of the present invention is significantly improved.

The present invention is compatible with shrinking or reducing device geometries. A thinner gate oxide and a shorter polysilicon reoxidation can be used compared to the prior art because the etching of spacers 41 and 42 does not significantly etch oxide layer 48 on semiconductor substrate 31. Accordingly, the ability to form source and drain regions with shallow junctions is improved without having to deposit or grow a separate implant screen layer after forming spacers 41 and 42. Furthermore, spacers 41 and 42 have less stress compared to conventional thick nitride spacers.

While the invention has been particularly shown and described with reference to preferred embodiments, it will be understood by those skilled in the art that changes in form and detail may be made without departing from the spirit and scope of the invention. For instance, semiconductor device 30 can be electrically isolated by a field oxide (not shown) formed by using a local oxidation of silicon (LOCOS) process. Furthermore, semiconductor device 30 can be formed in an n-well or a p-well as known in the art. Additionally, a threshold voltage adjust implant can be used to adjust the threshold voltage of semiconductor device 30.

Moreover, spacers 41 and 42 can be formed around and adjacent to other features besides a gate electrode. Accordingly gate electrode 32 is more generically referred to as feature 32. As an example, feature 32 can be a dielectric layer having a via, and spacers of the present invention can be formed in the via to reduce the width of the via and to increase the aspect ratio of the via. In this manner, the spacers of the present invention can be used, for example, to reduce the gate length of a back-filled gate for a gallium arsenide device. As an additional example, the spacers of the present invention can be used to provide electrical isolation between an emitter contact and a base contact of a bipolar transistor.

Therefore, in accordance with the present invention, it is apparent there has been provided an improved method of forming a spacer which overcomes the disadvantages of the prior art. The present invention teaches a method of fabricating a multi-layered spacer, wherein etchants for the different layers have sufficient etch selectivity between adjacent layers. The present invention avoids the problems associated with conventional oxide spacers and conventional nitride spacers. Field oxide loss and semiconductor substrate damage of the prior art does not occur in the present invention because the field oxide and the semiconductor substrate remain covered by a nitride layer and are not exposed during an RIE etch for the top oxide layer. An adequate spacer width is maintained by the present invention to prevent a short-channel effect from dominating the electrical behavior of a semiconductor device of the present invention. Because silicide formation is not blocked by nitride residues, polysilicon interconnect resistance is reduced, and circuit speed is improved. The present invention also produces other observed improvements in the electrical performance of semiconductor devices including, but not limited to, higher drain-to-source saturation current, superior isolation between transistors, and reduced contact resistance to active areas.

In conclusion, the present invention provides a method of forming a spacer which is cost-efficient, is manufacturable, and is compatible with existing semiconductor device process flows such as, for example, process flows using salicide techniques.

I claim:

1. A method of making a semiconductor component, the method comprising the steps of:

providing a semiconductor substrate;

fabricating a gate electrode over the semiconductor substrate;

disposing a first layer comprised of a first dielectric material over the semiconductor substrate and adjacent to the gate electrode;

disposing a second layer comprised of a second dielectric material over the first layer;

disposing a third layer comprised of the first dielectric material over the second layer;

anisotropically removing a first portion of the third layer with a first etchant, wherein a portion of the third layer remains over a portion of the second layer;

removing a second portion of the second layer with a second etchant different from the first etchant to form a portion of a spacer; and simultaneously removing a third portion of the first layer and the portion of the third layer to expose the portion of the second layer and to expose a portion of the semiconductor substrate.

2. The method according to claim 1, wherein the steps of disposing the first and third layers includes disposing silicon oxide and wherein the step of disposing the second layer includes disposing silicon nitride.

3. The method according to claim 2, wherein the step of disposing the first layer includes thermally growing the first layer on the semiconductor substrate and wherein the steps of disposing the second and third layers includes using a chemical vapor deposition.

4. The method according to claim 1, further comprising the step of implanting a lightly doped source region and a lightly doped drain region into the semiconductor substrate after the step of disposing the first layer.

5. The method according to claim 4, further comprising the step of implanting a source region and a drain region into the semiconductor substrate after the step of removing the second portion of the second layer.

6. The method according to claim 1, wherein the step of anisotropically removing the first portion of the third layer includes defining a width for the spacer.

7. The method according to claim 1, wherein the step of anisotropically removing the first portion of the third layer includes selectively etching the third layer versus the second layer, wherein the step of removing the second portion of the second layer includes isotropically etching and selectively etching the second portion of the second layer versus the first layer, and wherein the step of removing the third portion of the first layer includes isotropically etching and selectively etching the third portion of the first layer versus the semiconductor substrate.

8. The method according to claim 1, wherein the step of removing the third portion of the first layer includes exposing a fourth portion of the semiconductor substrate and a fifth portion of the gate electrode.

9. The method according to claim 8, further including the step of forming a silicide in the fourth portion of the semiconductor substrate and in the fifth portion of the gate electrode.

10. A method of fabricating a semiconductor component, the method comprising the steps of:

providing a substrate having a feature;

sequentially providing a first layer, a second layer, and a third layer over the substrate and adjacent to the feature; and forming a spacer adjacent to the feature by sequentially etching the third layer, the second layer, and the first layer, wherein etching the third layer uses a first etchant to selectively etch the third layer over the second layer and leaves a portion of the third layer overlying the second layer, wherein etching the second layer uses a second etchant different from the first etchant to selectively etch the second layer over the first layer, and wherein etching the first layer exposes a portion of the substrate and removes the portion of the third layer.

11. The method according to claim 10, wherein the step of sequentially providing the first, second, and third layers includes:

thermally growing a first oxide layer over the substrate;

depositing a nitride layer over the first oxide layer; and depositing a second oxide layer over the nitride layer.

12. The method according to claim 11, further comprising the step of providing a gate electrode for the feature, wherein the step of thermally growing the first oxide layer includes oxidizing the gate electrode.

13. The method according to claim 10, wherein the step of forming the spacer includes:

anisotropically etching the third layer with the first etchant to expose a first portion of the second layer; and etching the first portion of the second layer with the second etchant to expose a second portion of the first layer.

14. The method according to claim 13, wherein the step of forming the spacer further includes etching the second portion of the first layer with a third etchant different from the first and second etchants wherein the step of sequentially providing the first, second, and third layers includes providing oxide for the first and third layers.

15. A method of fabricating a semiconductor device, the method comprising the steps of:

providing a semiconductor substrate;

forming a gate electrode over the semiconductor substrate;

oxidizing the gate electrode, wherein oxidizing the gate electrode grows a first oxide layer over the semiconductor substrate and adjacent to and over the gate electrode;

depositing a nitride layer over the first oxide layer;

depositing a second oxide layer over the nitride layer;

anisotropically etching the second oxide layer to expose a first portion of the nitride layer;

overetching the second oxide layer with a first etchant, wherein the overetching etches the nitride layer and leaves a portion of the second oxide layer over a portion of the nitride layer;

etching the first portion of the nitride layer to expose a second portion of the first oxide layer, wherein etching the first portion of the nitride layer uses an etchant different from the first etchant; and simultaneously etching the second portion of the first oxide layer and the portion of the second oxide layer to expose a third portion of the semiconductor substrate, a fourth portion of the gate electrode, and the portion of the nitride layer.

16. The method according to claim 15, further comprising the steps of:

implanting a lightly doped source region and a lightly doped drain region self-aligned to the gate electrode after the step of oxidizing the gate electrode and before the step of depositing the nitride layer; and implanting a source region and a drain region self-aligned to the spacer after the step of etching the first portion of the nitride layer and before the step of etching the second portion of the first oxide layer.

17. The method according to claim 15, further including the step of forming a silicide contact in the third portion of the semiconductor substrate and in the fourth portion of the gate electrode after the step of etching the second portion of the first oxide layer.

18. The method according to claim 15, wherein the step of etching the first portion of the nitride layer includes isotropically etching the first portion of the nitride layer and wherein the step of etching the second portion of the first oxide layer includes isotropically etching the second portion of the first oxide layer.

19. The method according to claim 18, wherein the step of isotropically etching the first portion of the nitride layer includes using phosphoric acid and wherein the step of isotropically etching the second portion of the first oxide layer includes using hydrofluoric acid.

20. The method according to claim 15, wherein the step of depositing the second oxide layer includes using tetraethyl orthosilicate.

* * * * *